(12) United States Patent
Tavkhelidze et al.

(10) Patent No.: US 6,417,060 B2
(45) Date of Patent: Jul. 9, 2002

(54) METHOD FOR MAKING A DIODE DEVICE (75) Inventors: Avto Tavkhelidze; Larisa Koptonashvili; Zauri Berishvili; Givi Skhiladze, all of Tbilisi, GA (US)

(73) Assignee: Borealis Technical Limited, Gilbraltar ( * ) Notice: Subject to any disclaimer, the term of this patent is extended or adjusted under 35 U.S.C. 154(b) by 0 days.

(21) Appl. No.: 09/792,905

(22) Filed: Feb. 23, 2001

Related U.S. Application Data (60) Provisional application No. 60/184,852, filed on Feb. 25, 2000.

(51) Int. Cl.[7] ............................................. H01L 21/20
(52) U.S. Cl. ....................................... 438/380; 438/141
(58) Field of Search .............................. 438/380, 328, 438/133, 141

(56) References Cited

U.S. PATENT DOCUMENTS 3,740,592 A * 6/1973 Engdahl et al. ........ 165/104.19
4,011,582 A * 3/1977 Cline et al. .................... 257/44
4,063,965 A * 12/1977 Cline et al. ..................... 117/1
6,214,651 B1 * 4/2001 Cox .............................. 427/77

* cited by examiner

Primary Examiner—Tuan H. Nguyen

(57) ABSTRACT

A method for manufacturing a pair of electrodes comprises fabricating a first electrode with a substantially flat surface and placing a sacrificial layer over a surface of the first electrode, wherein the sacrificial layer comprises a first material. A second material is placed over the sacrificial layer, wherein the second material comprises a material that is suitable for use as a second electrode. The sacrificial layer is removed with an etchant, wherein the etchant chemically reacts with the first material, and further wherein a region between the first electrode and the second electrode comprises a gap that is a distance of 50 nanometers or less, preferably 5 nanometers or less. Alternatively, the sacrificial layer is removed by cooling the sandwich with liquid nitrogen, or alternatively still, the sacrificial layer is removed by heating the sacrificial layer, thereby evaporating the sacrificial layer.

18 Claims, 5 Drawing Sheets

METHOD FOR MAKING A DIODE DEVICE

This application claims priority from Provisional application Ser. No. 60/184,852, filed Feb. 25, 2000.

FIELD OF THE INVENTION

This invention relates generally to a method for making diode devices and more specifically to an improved method of making diode devices.

BACKGROUND OF THE INVENTION

The present invention is related to diode devices, in particular to methods for making diode devices and particularly for making a pair of electrodes that may be used in a diode device. The term diode devices encompass, for example, thermionic converters and generators, photoelectric converters and generators, and vacuum diode heat pumps. It is also related to thermotunnel converters.

WO99/13562 discloses a method for making pairs of electrodes whose surfaces replicate each other. This approach uses solvents and reactive solutions, and involves heating and evaporating metal surfaces. The present invention offers a novel means for providing similarly paired electrodes by a more rapid, more economical and more environment-friendly than existing approaches.

SUMMARY OF THE INVENTION

From the foregoing, it may be appreciated that a need has arisen for an improved method of making a diode device that is faster, cheaper, easier, and more efficient. In accordance with one embodiment of the present invention, a method for manufacturing a pair of electrodes comprises the steps of: fabricating a first electrode with a substantially flat surface; placing a sacrificial layer over a surface of said first electrode, wherein said sacrificial layer comprises a first material; placing a second material over said sacrificial layer, wherein said second material comprises a material that is suitable for use as a second electrode; and placing said sacrificial layer in a cold environment wherein said cold environment cools said sacrificial layer.

In accordance with another embodiment of the present invention, a method for manufacturing a pair of electrodes comprises the steps of: fabricating a first electrode with a substantially flat surface; placing a sacrificial layer over a surface of said first electrode, wherein said sacrificial layer comprises a sublimative material; placing a material that is suitable for use as a second electrode over said sacrificial layer; and heating said sacrificial layer, wherein said step of heating evaporates said sacrificial layer.

It is a technical advantage of the present invention to make diode devices faster, cheaper, easier, and more efficient.

Another technical advantage of the present invention is that it produces a reliable, small separation between an anode and a cathode, and this spacing is maintained and stabilized with piezo-electric actuators. Another technical advantage of the present invention is that it may make this separation in a diode device.

Other technical advantages of the present invention will be readily apparent to one skilled in the art from the following figures, descriptions, and claims.

BRIEF DESCRIPTION OF THE DRAWING

For a more complete understanding of the present invention and the technical advantages thereof, reference is now made to the following description taken in conjunction with the accompanying drawings, in which.

DETAILED DESCRIPTION OF THE INVENTION

The embodiments of the present invention and its technical advantages are best understood by referring to FIGS. 1–5. While in this description of the present invention the actuating element is often described as being connected to the collector electrode, in the present invention the actuating elements may be applied to either the emitter electrode or the collector electrode. Further, the present invention may be used in a number of devices, as stated herein, including, for example, (i) a device which uses a thermal gradient of any kind to generate electrical power or energy output using thermionics, thermotunneling, or other methods as described herein; (ii) a device which uses electrical power or energy to pump heat, thereby creating, maintaining, or degrading a thermal gradient using thermionics, thermotunneling, or other methods as described herein; and (iii) as any diode which employs a gap between the anode and the cathode, or the collector and emitter, and which causes or allows electrons to be transported between the two electrons, across or through the gap (with or without a vacuum in the gap). Alternatively, the device of the present invention may be integrated into or used for any ordinary diode applications.

Further, when surface features of two facing surfaces of electrodes are described as "matching," it means that where one surface has an indentation, the other surface has a protrusion and vice versa. Thus when "matched," the two surfaces are substantially equidistant from each other throughout their operating range.

Figure 1:
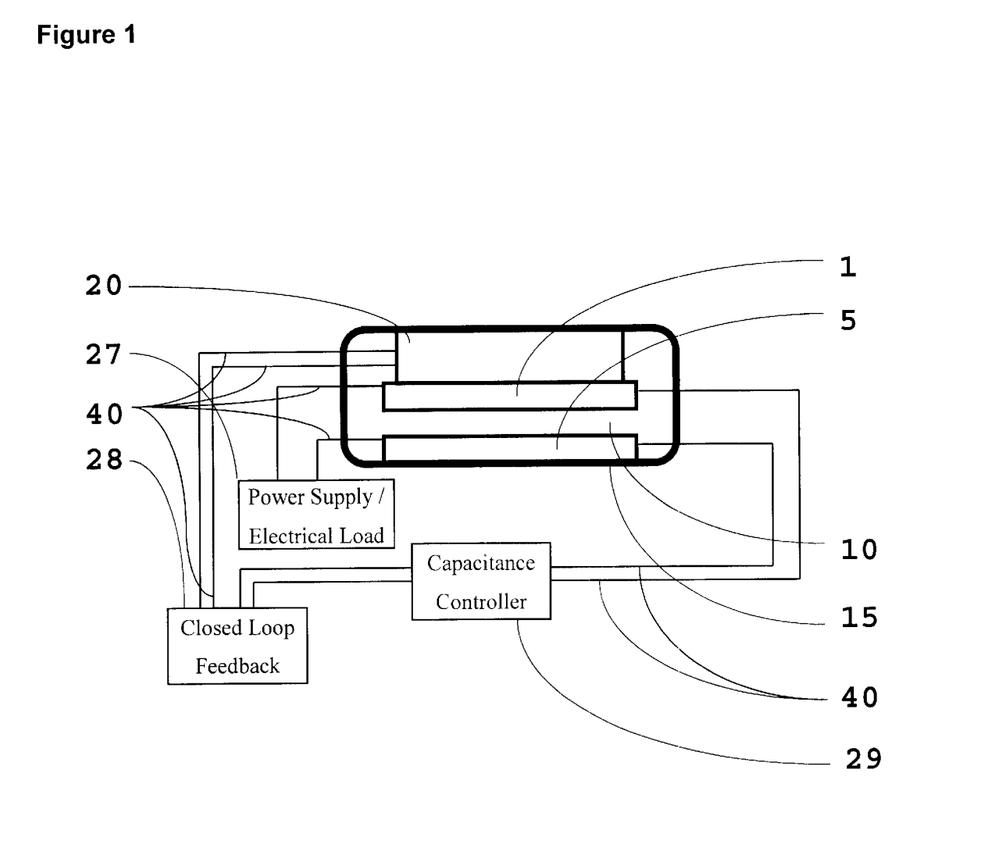
FIG. 1 is a diagrammatic representation of one embodiment of the electrode configuration of the present invention.

Referring now to FIG. 1, two electrodes 1 and 5 are separated by a region 10 between an emitter and a collector and housed in a housing 15. Electrode 1 is mechanically connected to a piezo-electric actuator 20. An electric field is applied to the piezo-electric actuator via connecting wires 40 which causes the actuator to expand or contract longitudinally, thereby altering the distance of region 10, which is between electrodes 1 and 5. Electrodes 1 and 5 are connected to a capacitance controller 29 which generates a reference electrical signal for closed loop feedback electronics 28. Closed loop feedback electronics 28 applies electrical signals to actuator 20, which in turns maintains a constant distance between electrode 1 and 5. Emitter 5 may also be referred to as the "hot side" and collector 1 may also be referred to as the "cold side." Thus, the emitter may be the side where heat is applied, if electrical power is to be generated from the heat. When functioning as a heat pump, the collector may be the side that provides cooling, if refrigeration is to be generated from electrical power applied from the power supply. Piezo-electric actuator 20 may be on either the collector or the emitter, however, it is preferable to have piezo electric actuator 20 on the cold side as the higher temperatures on the hot side may interfere with proper operation of piezo electric actuator 20.

Figure 2:
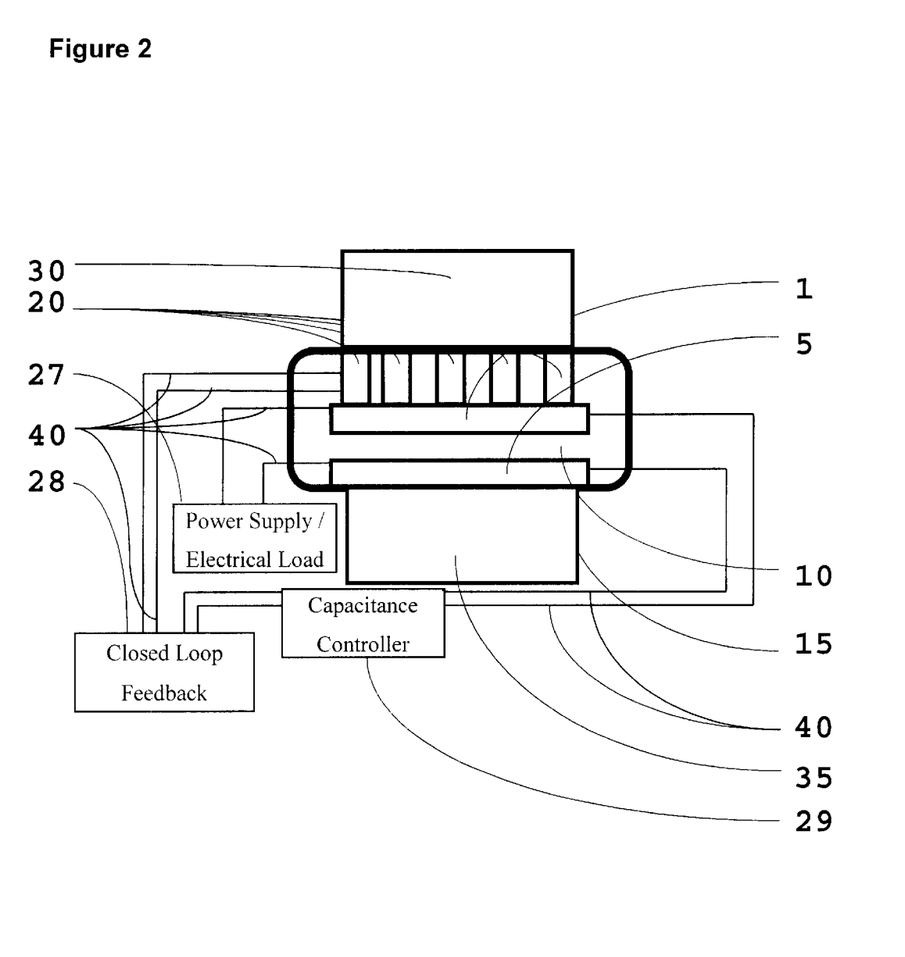
FIG. 2 is a diagrammatic representation of one embodiment of the electrode configuration of the present invention.

Referring now to FIG. 2, two electrodes 1 and 5 are separated by a region 10 and housed in a housing 15. Electrode 1 is attached to a number of piezo-electric actuators 20 at intervals. An electric field is applied to the piezo-electric actuators via connecting wires 40 which causes the actuators to expand or contract longitudinally, thereby altering the longitudinal distance of region 10 between electrodes 1 and 5. Electrodes 1 and 5 are connected to capacitance controller 29. The longitudinal distance of region 10 between electrodes 1 and 5 is controlled by applying an electric field to piezo-electric actuators 20. The capacitance between emitter 5 and collector 1 is measured and controlling circuitry 29 adjusts the field applied to piezo-electric actuators 20 to hold the capacitance, and consequently the region 10 between the electrodes, at a predetermined fixed value. Alternatively the controller may be set to maximize the capacitance and thereby minimize region 10 between the electrodes. The diagram shown in FIG. 2 may be used as a thermionic device and/or as a tunneling device, and may be used to function as a device to create electrical power or energy output or as a device to pump heat. Capacitance controller 29 may be composed of multiple elements, and each piezo actuator 20 may receive its own distinct signal, independent from the control of surrounding elements.

If it is used as a thermionic device, then electrodes 1 and 5 are made from, or are coated with, a thermionically emissive material having a work function consistent with the copious emission of electrons at the temperature of thermal interfaces 30 and 35. The specific work functions may be determined by calculation.

When functioning as a heat pump, electrons emitted from emitter 5 move across an evacuated space 10 to a collector 1, where they release their kinetic energy as thermal energy which is conducted away from collector 1 through housing 15 to thermal interface 30, which is, in this case, hotter than thermal interface 35, which the electron emission serves to cool.

When functioning as a device to generate electrical power or energy output, region 10 may be evacuated. Electrons emitted from emitter 5 move across the evacuated space of region 10 to collector 1, where they release their kinetic energy as thermal energy which is conducted away from collector 1 through housing 15 to thermal interface 30, and a current is generated for electrical load 27. The feedback loop from the capacitance controller to the piezo elements allows for the device to adjust for varying conditions, including vibration, shock, and thermal expansion.

When functioning as a tunneling device of the present invention, as one side of the device becomes hot and its components expand, the distance between the electrodes may be maintained at a fixed distance with the feedback loop between capacitance controller 29 and piezo elements 20. Provided that the surface of emitter 5 and collector 1 are made sufficiently smooth (or, as discussed below, matching one another), emitter 5 may be moved into such close proximity to collector 1 that quantum tunneling between the electrodes occurs. Further, region 10 may or may not be evacuated.

Alternatively, atoms, such as cesium vapor, or alternatively an inert gas, may be in region 10. When the gap distance between the electrodes is on the order of tens of angstroms, thermal conduction through a gas is considerably lessened. In the tunneling embodiments disclosed in this application, this advantage is noted, especially for applications where thermal conduction is a concern, such as a device to generate electrical power or energy output and heat pumps. Hence, the region 10 is in some embodiments filled with an inert gas or cesium vapor.

Figure 3:
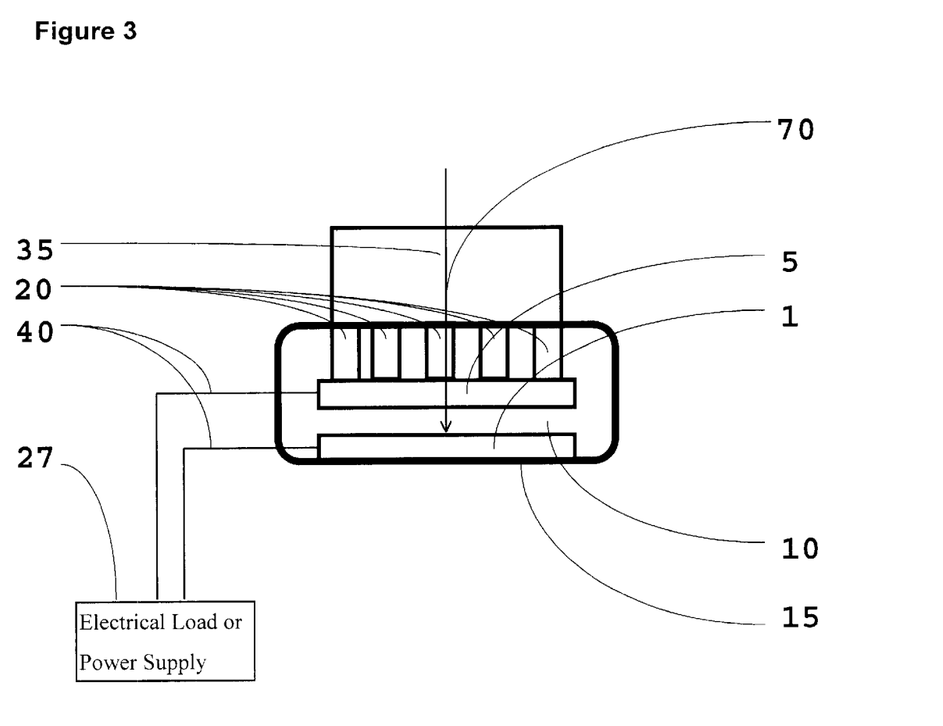
FIG. 3 is a diagrammatic representation of one embodiment of a diode device embodying the present invention.

Referring now to FIG. 3, which shows a thermal interface 35, electrical connectors 40, and electrical load/power supply 27 for a photoelectric generator embodiment of the device shown in FIG. 2. For the sake of clarity, in FIG. 3, capacitance controller 29 and additional connecting wires 40 shown in FIG. 2 have been omitted. A light beam 70 passes through housing 15 and is absorbed by emitter 5. Emitter 5 is made from, or is coated with, a photoelectrically emissive material having a work function consistent with the copious emission of electrons at the wavelengths of light beam 70. In FIG. 3, region 10 is evacuated. Electrons emitted from emitter 5 move across the evacuated space of region 10 to a collector 1, where they release their kinetic energy as thermal energy which is conducted away from collector 1 and housing 15 to thermal interface 35. The electrons return to emitter 5 by means of external circuit 40 thereby powering electrical load/power supply 27. The spacing of region 10 between electrodes 1 and 5 is controlled as described above (see FIG. 2). Thus, as the device becomes hot and its components expand, the distance between the electrodes may be maintained at a fixed distance. Provided that the surface of emitter 5 and collector 1 are made sufficiently smooth, collector 1 may be moved into such close proximity to emitter 5 that quantum tunneling between the electrodes occurs. Under these conditions, it is not necessary that region 10 should be evacuated, and the device operates as a tunneling device used to generate electrical power or energy output. It should be noted that a photoelectric device used to generate electrical power or energy output may use a temperature differential, by collecting some of the solar energy in heat form. In this embodiment, the device would function as the device used to generate electrical power or energy output, as in FIG. 2, with the heat energy provided as solar energy.

The device in FIG. 3 may alternatively be primarily photoelectric, where direct photon-electron contact results in the electron either topping the work-function barrier and emitting thermionically, or, in the tunneling version, the incident photon may cause the electron to tunnel. The device may also be a combination of the above, providing any combination of thermionic emission caused by solar heat, thermionic emission caused by direct photoelectric effects, thermotunneling from solar heat, or tunneling emission caused by direct photoelectric effects.

Figure 4:
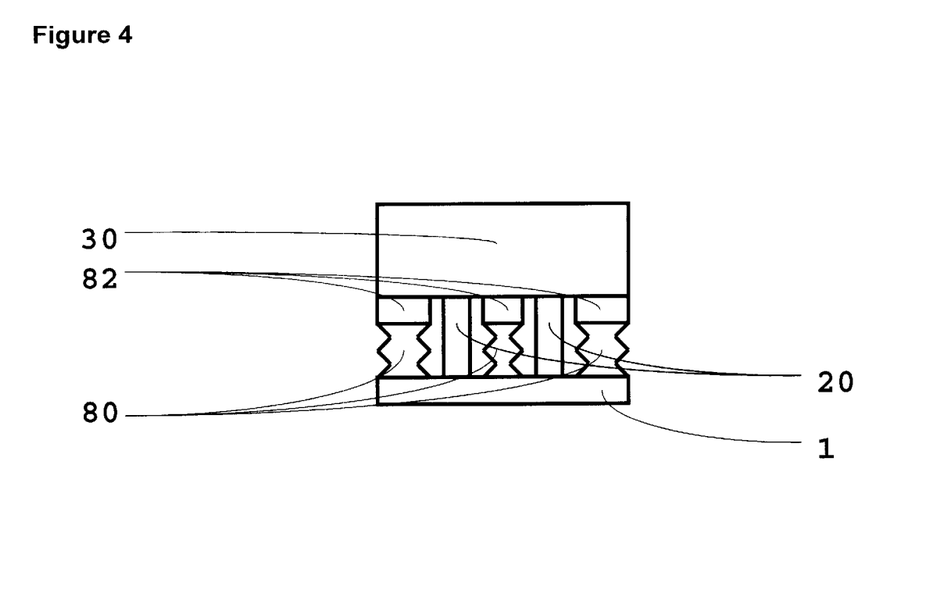
FIG. 4 is a diagrammatic representation of one embodiment of a device illustrating how heat transfer is facilitated.

Referring now to FIG. 4, a preferred embodiment for facilitating heat transfer between a thermal interface 30 and an electrode 1 is shown. Corrugated tubes 80, preferably fabricated from stainless steel, are shown as forming part of the structure between electrode 1 and thermal interface 30. These tubes may be positioned with many variations, and act to allow for the movement of the positioning elements 20 and of the electrode 1 while maintaining support, containment, or the like for the device, by being able to be stretched and/or compressed longitudinally. In some embodiments, corrugated tubes 80 may form the walls of a depository of a metal powder 82, preferably silver powder with a grain size of between 3 and 5 microns. More metal powder 82 would be used to receive heat transferred to the collector electrode 1, but the surroundings of the metal powder would be made smaller as the positioning elements 20 cause the electrode to move upwards. Hence, an expandable depository made from corrugated tubing 80 is preferably used. Corrugated tubes 80 may also enclose the entire device, to allow for movement, as well as individual piezo actuators 20.

On a device having electrodes with an area on the order of 1×1 cm², surface irregularities are likely to be such that electrode spacing may be no closer than 0.1 to 1.0 μm. However for smaller electrodes, with an area on the order of 0.05×0.05 cm², surface irregularities will be sufficiently small to allow the electrodes to be moved to a separation of approximately 5 nanometers or less, which is sufficiently close for quantum tunneling to occur. Moreover, it is preferable for large (with an area on the order of 1×1 cm²) electrodes to be brought into close proximity to more easily facilitate electron tunneling.

Figure 5:
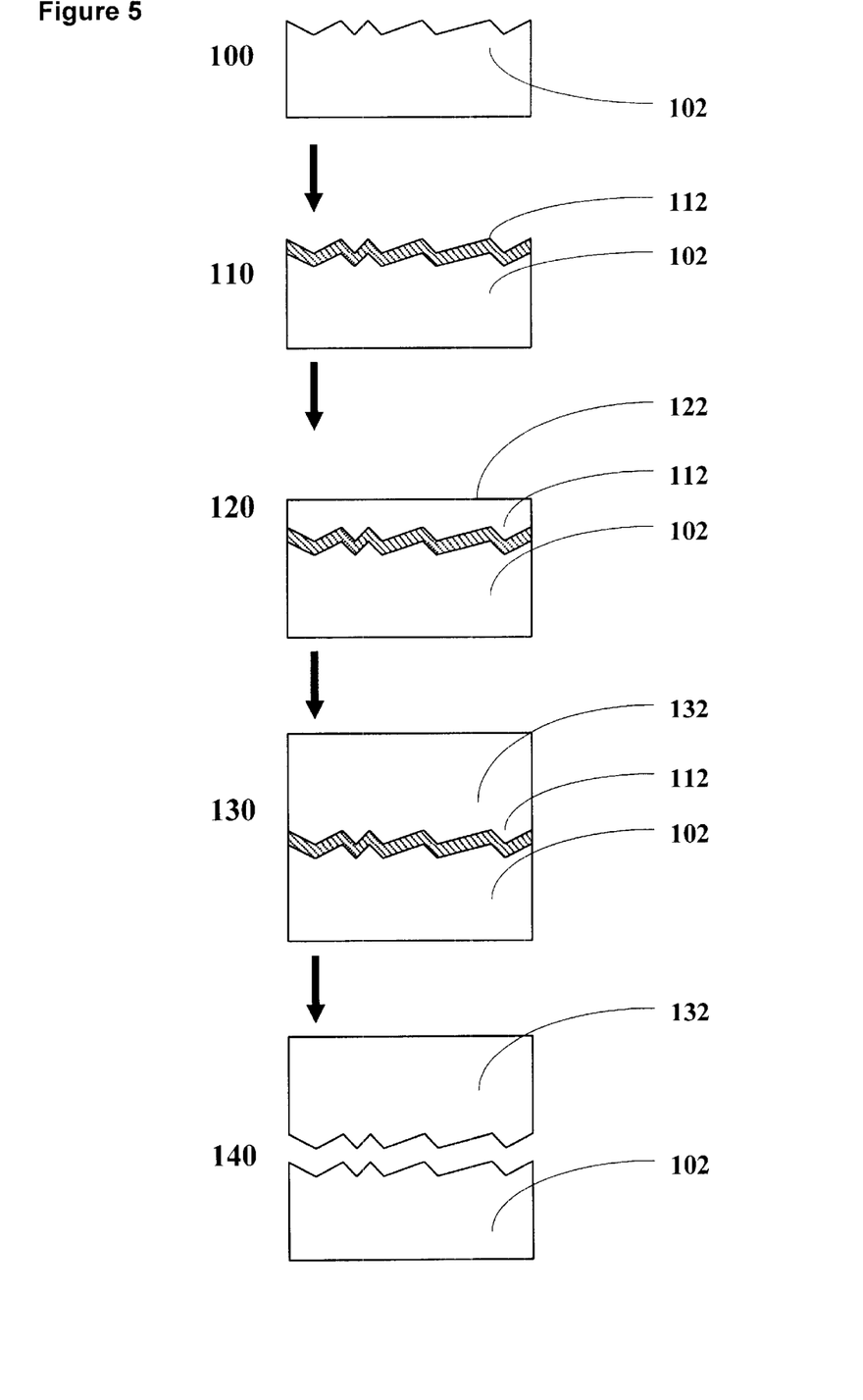
FIG. 5 is a schematic representation of the method of the present invention.

The diode devices described in the present invention may be produced using various methods. For example, one such approach is illustrated in FIG. 5, which in schematic form describes a method for producing pairs of electrodes having substantially smooth surfaces in which any topographical features in one are matched in the other. The method involves a first step 100 in which a polished monocrystal of material 102 is provided. This forms one of the pair of electrodes. Material 102 may also be polished tungsten, or other materials. In a step 110 a thin layer of a second material 112, preferably Si, Ti, or Mo, is deposited onto the surface of the material 102. This layer is sufficiently thin so that the shape of the polished surface 102 is repeated with high accuracy. A thin layer of a third material is deposited on layer 112 in a step 120, and in a step 130 it is thickened using electrochemical growth to form second electrode 132. This forms the second electrode. In a step 140 the composite formed in steps 100 to 130 is cooled. Preferably, the cold environment is less than −25° C. (248° K) or is less than −50° C. (223° K). More preferably, the cold environment is less than −100° C. (173° K) or less than −150° C. (123° K). Most preferably, liquid nitrogen is used to establish the cold environment. Preferably, sandwich 150 may be immersed in liquid nitrogen, or liquid nitrogen vapor may be applied to sandwich 150. Materials used to make electrodes 102 and 132 are chosen so that they have different coefficients of linear thermal expansion. Thus when composite 150 is cooled, the two electrodes 102 and 132 of reduce differently in linear dimensions. This causes controlled mechanical tension between electrodes 102 and 132. The thickness and hardness of both electrodes 102 and 132, however, is higher than the thickness and hardness of sacrificial layer 112. As result, sacrificial layer 112 disintegrates and turns to powder while being cooled by the liquid nitrogen, making electrodes 102 and 132 separable. The resulting powder from sacrificial layer 112 may be removed using a suitable a suitable solvent or reactive solution. Thus, by using liquid nitrogen to cool sandwich 150, the sandwich 150 is opened using forces which arise due to the different thermal expansion of the electrodes. Accordingly, the cold environment may be any environment with conditions that are cold enough to cool sandwich 150 such that tension between electrodes 102 and 132 destroys sacrificial layer 112.

In an alternative embodiment (not shown in FIG. 5), electrode 102 additionally comprises a third material, which has a different coefficient of thermal expansion to the second material 112. Preferably the coefficients of expansion differ by a factor of 3 or more.

After the sacrificial layer 112 has been reduced to powder, first electrode 102 and second electrode 132 are somewhat separated to allow the removal of the remnants of sacrificial layer 112. First and second electrodes 102 and 132 are then returned back to a close proximity by piezoelectric actuators, such that they are no more than approximately 5–10 nanometers apart. Preferably, the two electrodes will be separated less than or equal to approximately 100 angstroms. More preferably, the two electrodes will be separated less than or equal to approximately 50 angstroms.

In another embodiment, a sublimative material (for example Cd (Cadmium), Zn, NA, K, or the like) may be used as the sacrificial layer in the present invention. These materials begin to evaporate before the melting temperature is reached. Considerable vapor pressure is developed inside the sandwich. Pressure opens the sandwich even before the melting point of Cadmium is reached. For example, with Cadmium, the vapor pressure at 150° C. is enough to open the sandwich. This allows a lower temperature to be used to open the sandwich. Thus, to remove the sacrificial layer when a sublimative material is used as the sacrificial layer, the sacrificial layer is heated. By heating the sacrificial layer, when it is comprised of a sublimative material, the sacrificial layer evaporates (or is boiled off) leaving the sandwich with a gap between the electrodes. The gap may be as described above, for example less than 50 nanometers, less than 100 angstroms, or less than 50 angstroms in distance.

Any of the above methods may be used to fabricate the diode devices described herein. Thus, for example, the actuators, preferably piezo actuators, may be introduced to keep region 10 at a desired distance. The actuators are preferably added after step 140. Alternatively still, region 10 may be evacuated or may have an inert gas, such as He or Ar, or a vapor of cesium, introduced into region 10.

When considering a device of the present invention wherein the two electrodes are close enough to one another to allow for electron tunneling to occur, thermal expansion should be considered. If thermal expansion is not taken into account, then the two electrodes could touch, causing the device to not optimally function. If the cold side of the device has a thermal expansion coefficient larger than that of the hot side, then the risk of touching is minimized. A preferred embodiment for this selection process, depending on the design temperature ranges of the device, is that the cold side should have a thermal expansion coefficient which is more than that of the hot side. Specific embodiments include the use of Silver or Aluminum on the cold side and Mo or Si on the hot side. The thermal expansion coefficient of aluminum is approximately 6 times that of Mo or Si and when either of these materials are used for the electrodes, when combined with the electrode matching invention shown in FIG. 5, they should tolerate a difference in temperature between the two sides. For example, if the hot side is heated by 500° C. and the cold side is heated by 80° C., ideal matching of the surfaces will occur. Ti could also be used on the hot side, but aluminum's thermal expansion coefficient is approximately 3 times that of Ti as opposed to 6 times that of Mo or Si.

Included in this invention is a method for constructing electrodes with matching topologies, the use of thermotunneling to produce a cooling effect, the use of solar energy as the motive energy for the devices of the present invention, the use of small, and angstrom-scale gaps for insulation.

Although the above specification contains many specificities, these should not be construed as limiting the scope of the invention but as merely providing illustrations of some of the presently preferred embodiments of this invention. For example, the piezo-electric, electrostrictive or magnetostrictive actuators could be used to position either or both electrodes. Such actuators do not need to be active once the device has been manufactured. For small temperature variations, it is conceivable that the capacitance loop and power supply for the actuators themselves will not be necessary, and the electrodes may be locked into place in the manufacturing or packaging process. Thus in operation the actuators should not be necessary, as the gap would not be compromised with smaller temperature fluctuations.

In the above specification, capacitance is used to measure the distance between the electrodes. Other methods may be used, including measuring the tunneling current and optical interferometry. The generated current produced by a thermionic, thermotunneling or photoelectric device may also be measured to assess the separation of the electrodes. Other properties which may be measured include heat, for example the temperature of one or both of the electrodes may be used to initiate programmed actuation of the piezo-electric, electrostrictive or magnetostrictive elements. The position of the electrodes may also be set according to the length of time the device has been in operation. Thus it may be envisaged that the electrodes are set at a certain distance when the device is first turned on, and then the positioning of the electrodes is adjusted after certain predetermined time intervals.

In addition, if the inter-converters are constructed using micro-machining techniques, the controlling circuitry for the separation of the electrodes may be deposited on the surface of the wafer next to the piezo-electric, electrostrictive or magnetostrictive actuators.

The devices of the present invention may be constructed as MicroElectroMechanicalSystems (MEMS) devices using micro-machining of an appropriate substrate. Integrated circuit techniques and very large scale integration techniques for forming electrode surfaces on an appropriate substrate may also be used to fabricate the devices. Other approaches useful in the construction of these devices include vapor deposition, fluid deposition, electrolytic deposition, printing, silk screen printing, airbrushing, and solution plating.

Substrates which may be used in the construction of these devices include silicon, silica, glass, metals, and quartz.

Additionally, the active control elements may be pulsed, which generates AC power output when the device is used as a power generator. The pulsing speeds of piezo elements are well within the requirements necessary for standard alternating current outputs.

Moreover, the electrodes made according to the present invention may be used in diode devices, vacuum diode devices, heat pumps, any other devices that are based on tunneling effects, and the like.

While this invention has been described with reference to numerous embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention as claimed below.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

We claim:

1. A method for manufacturing a pair of electrodes, said method comprising the steps of:

a) fabricating a first electrode having a substantially flat surface;

b) placing a sacrificial layer over a surface of said first electrode, wherein said sacrificial layer comprises a first material;

c) placing a second material over said sacrificial layer, wherein said second material comprises a material that is suitable for use as a second electrode, wherein said second material has a thermal expansion coefficient that is different to the thermal expansion coefficient of said first electrode, whereby a composite is formed; and d) cooling said composite whereby thermal stress in said sacrificial layer causes it to disintegrate.

2. The method of claim 1, wherein said cold environment comprises a temperature of −50° C. or less.

3. The method of claim 1, wherein said cooling step comprises contacting said composite with liquid nitrogen.

4. The method of claim 3, wherein said cooling step creates a gap between said first electrode and said second electrode.

5. The method of claim 3, further comprising the steps of:

a) attaching said first electrode and said second electrode to an actuator; and b) using said actuator to maintain a region between said first and second electrodes, wherein topographical features on the surface of said first electrode are maintained in spatial orientation with a matching topographical feature on said second electrode.

6. The method of claim 1, wherein said sacrificial layer comprises Si, Ti, or Mo.

7. The method of claim 1, wherein said first electrode comprises a third material and wherein said second material has a thermal expansion coefficient that is different from a thermal expansion coefficient of said third material.

8. The method of claim 7, wherein said thermal expansion coefficients of said second and third materials are different by a factor of 3 or greater.

9. The method of claim 7, wherein said cold environment causes mechanical tension between said first electrodes and said second electrode.

10. The method of claim 9, further comprising destroying said sacrificial layer with said mechanical tension.

11. A method for manufacturing a pair of electrodes, said method comprising the steps of:

a) fabricating a first electrode having a substantially flat surface;

b) placing a sacrificial layer over a surface of said first electrode, wherein said sacrificial layer comprises a sublimative material;

c) placing a material that is suitable for use as a second electrode over said sacrificial layer; and d) heating said sacrificial layer, wherein said step of heating evaporates said sacrificial layer.

12. The method of claim 11, wherein said sublimative material is cadmium.

13. The method of claim 11, wherein after said heating step, said first electrode and said second electrode are separated by 50 nanometers or less.

14. The method of claim 11, wherein after said heating step, said first electrode and said second electrode are separated by 100 angstroms or less.

15. The method of claim 11, wherein after said heating step, said first electrode and said second electrode are separated by 50 angstroms or less.

16. The method of claim 11, wherein said step of heating creates a gap between said first electrode and said second electrode.

17. The method of claim 11, wherein said step of heating is applied to said sacrificial layer, said first electrode and said second electrode.

18. The method of claim 11 further comprising the steps of:

a) attaching said first electrode and said second electrode to an actuator; and b) using said actuator to maintain a region between said first and second electrodes, wherein topographical features on the surface of said first electrode are maintained in spatial orientation with a matching topographical feature on said second electrode.

* * * * *